United States Patent [19]

Kapoor

[11] Patent Number: 5,472,901
[45] Date of Patent: Dec. 5, 1995

[54] PROCESS FOR FORMATION OF VIAS (OR CONTACT OPENINGS) AND FUSES IN THE SAME INSULATION LAYER WITH MINIMAL ADDITIONAL STEPS

[75] Inventor: Ashok K. Kapoor, Palo Alto, Calif.

[73] Assignee: LSI Logic Corporation, Milpitas, Calif.

[21] Appl. No.: 348,603

[22] Filed: Dec. 2, 1994

[51] Int. Cl.$^6$ .............................. H01L 21/70; H01L 27/00
[52] U.S. Cl. ........................ 437/60; 437/195; 437/922; 148/DIG. 55
[58] Field of Search .................. 437/922, 52, 60, 437/195; 257/529–530; 148/DIG. 55

[56] References Cited

U.S. PATENT DOCUMENTS

| | | | |
|---|---|---|---|
| 4,647,340 | 3/1987 | Szluk et al. | 156/662 |
| 4,679,310 | 7/1987 | Ramachandra et al. | 29/577 R |
| 4,984,054 | 1/1991 | Yamada | 257/529 |
| 5,026,666 | 6/1991 | Hills et al. | 437/195 |
| 5,059,555 | 10/1991 | Iranmanesh et al. | 437/192 |
| 5,124,780 | 6/1992 | Sandhu et al. | 357/67 |
| 5,144,404 | 9/1992 | Iranmanesh et al. | 357/51 |
| 5,166,556 | 11/1992 | Hsu et al. | 307/465 |
| 5,175,122 | 12/1992 | Wang et al. | 437/67 |
| 5,212,102 | 5/1993 | Iranmanesh et al. | 437/31 |
| 5,212,352 | 5/1993 | Brighton et al. | 174/264 |
| 5,244,836 | 9/1993 | Lim | 437/192 |

*Primary Examiner*—Olik Chaudhuri
*Assistant Examiner*—H. Jey Tsai
*Attorney, Agent, or Firm*—John P. Taylor

[57] ABSTRACT

A process and resulting product are described for forming an integrated circuit structure with horizontal fuses on an insulation layer formed over other portions of the integrated circuit structure by forming rectangular recesses in the insulation layer which are subsequently filled during a subsequent metal deposition step which also serves to fill with the same metal vias or contact openings which have been etched through the insulation layer. Subsequent planarization of the deposited metal layer down to the vias or contact openings, i.e. to remove the portions of the metal layer over the insulation layer, leaves the metal in the vias or contact openings and also leaves metal stringers on the sidewalls of the rectangular recess which then serve as fusible links (fuses) which are then connected to one or more metal lines thereafter formed on the insulation layer.

13 Claims, 5 Drawing Sheets

PROCESS FOR FORMATION OF VIAS (OR CONTACT OPENINGS) AND FUSES IN THE SAME INSULATION LAYER WITH MINIMAL ADDITIONAL STEPS

BACKGROUND OF THE INVENTION

1. Field of the Invention

This invention relates to the formation of fuses in an integrated circuit structure. More particularly, this invention relates to the formation of vias or contact openings to an underlying structure, and fuses in the same insulation layer with a minimum of additional steps.

2. Description of the Related Art

In the formation of integrated circuit structures, it is sometimes desirable to provide devices such as programmable read only memory devices (PROMs) in which a fusible link or fuse is provided for each memory cell. Particular fuses to particular memory cells may then be later blown, i.e., during a write sequence, by passing sufficient current through the particular fuse to blow the fuse and thereby sever electrical connection to that particular memory cell.

Such fuses have been constructed either horizontally or vertically in the integrated circuit using conductive material such as metal or metal silicides. Horizontal fuses may be formed, for example, from a patterned layer of conductive material, while vertical fuses may comprise vertical openings in an insulation layer filled with a conductive material, such as a filled via in an insulation layer between two conductive layers or a filled contact opening in an insulation layer between a contact of an active device and a first metal layer.

Usually, however, regardless of the type of material used for the fuse, or its geographical disposition on the integrated circuit structure, i.e. either horizontal or vertical, formation of the fuse or fuses requires a number of additional mask, etching, deposition steps which all add to the processing time and expense of the process, as well as providing additional steps at which defects or other problems may occur which could adversely impact the yield.

It would, therefore, be highly desirable to provide a process for the construction of fuses in the formation of an integrated circuit structure in which additional processing steps to form the fuses are minimized or eliminated.

SUMMARY OF THE INVENTION

The invention comprises a process and the resulting product comprising the forming of an integrated circuit structure with horizontal fuses on an insulation layer formed over other portions of the integrated circuit structure by forming rectangular recesses in the insulation layer which are subsequently filled during a subsequent metal deposition step which also serves to fill with the same metal vias or contact openings which have been etched through the insulation layer. Subsequent planarization of the deposited metal layer down to the vias or contact openings, i.e. to remove the portions of the metal layer over the insulation layer, leaves the metal in the vias or contact openings and also leaves metal stringers on the sidewalls of the rectangular recess which then serve as fusible links (fuses) which are then connected to one or more metal lines thereafter formed on the insulation layer.

DETAILED DESCRIPTION OF THE INVENTION

Figure 1:
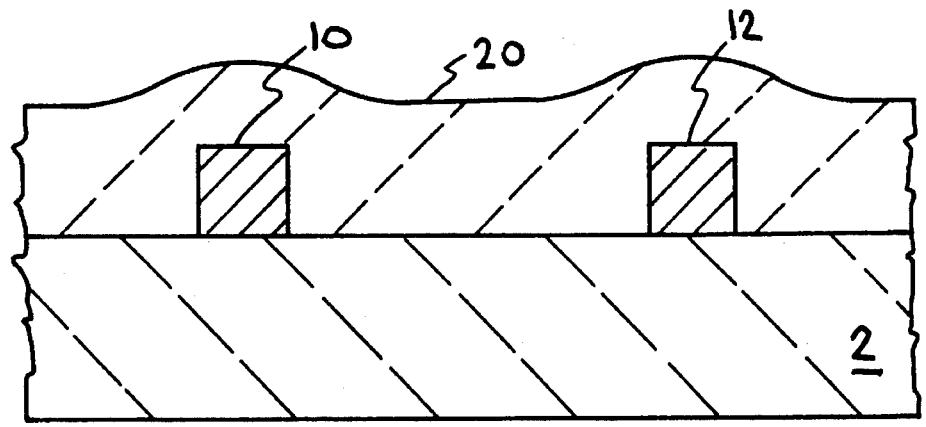
FIG. 1 is a fragmentary vertical cross-section view of a typical integrated circuit structure having metal lines formed thereon and an insulation layer formed over the metal lines, wherein vias will be subsequently etched through the insulation layer to electrically connect an upper metal level with the metal lines.

The invention provides for the formation of fuses structure in and on an integrated circuit structure in a manner in which the need for additional processing steps is minimized and/or eliminated. Referring to FIG. 1, a typical integrated circuit structure is generally indicated at 2 having, in the illustrated embodiment, metal lines 10 and 12 formed thereon over an underlying insulation layer comprising a portion of integrated circuit structure 2. An insulation layer 20 is then shown formed over metal lines 10 and 12 and integrated circuit structure 2. Typically, insulation layer 20 will comprise silicon oxide, although silicon nitride or any other equivalent insulation material could be utilized in the formation of insulation layer 20. Typically, metal lines 10 and 12, when present, will comprise aluminum, although other conductive metals, including gold, platinum, titanium, tungsten, or alloys thereof could be utilized instead of aluminum. In some instances, doped polysilicon may be used instead of metal for lines 10 and 12.

In the structure shown in FIG. 1, vias will eventually be cut (etched) through insulation layer 20 to electrically interconnect a patterned metal layer subsequently formed over insulation layer 20 with underlying metal lines 10 and 12, as will be described below.

Figure 1A:
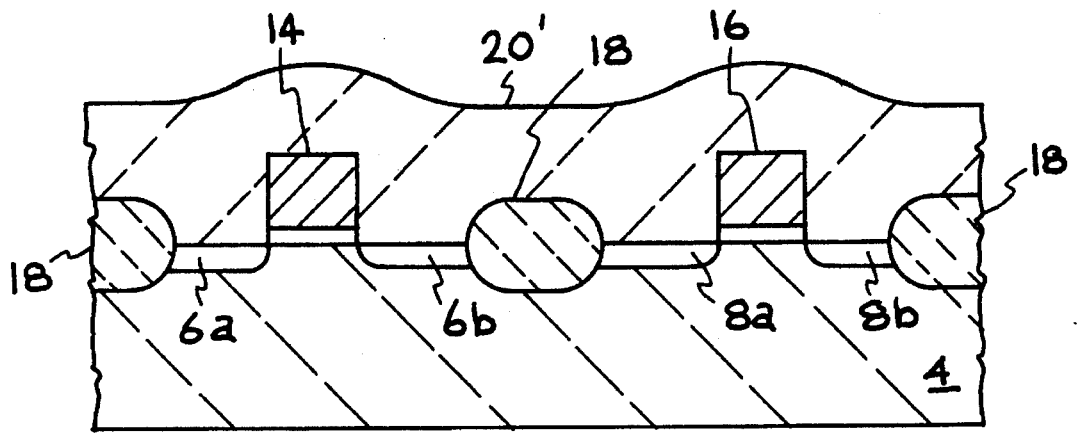
FIG. 1A is a fragmentary vertical cross-section view of another typical integrated circuit structure to which the process of the invention may be applied, with MOS devices shown formed in a substrate with raised gate electrodes and an insulation layer formed over the gate electrodes, wherein contact openings will be subsequently etched through the insulation layer to electrically connect a first metal level with the gate electrodes.

Alternatively, the process and fuse structure of the invention to be described below may be formed over a first insulation layer deposited directly over active devices formed in the semiconductor substrate of the integrated circuit structure, as shown in FIG. 1A. In FIG. 1A, a substrate 4 is shown having MOS structures formed therein bounded by field oxide portions 18 and comprising source regions 6a and 6b and drain regions 8a and 8b, with raised polysilicon gate electrodes 14 and 16 formed therebetween. An insulation layer 20' is then formed over the surface of substrate 4 and raised gate electrodes 14 and 16, resulting in a structure which topographically is similar in appearance to the structure of FIG. 1, except that the openings which will subsequently be cut (etched) through insulation layer 20' from a subsequently deposited patterned metal layer to gate electrodes 14 and 16 thereunder will be referred to as contact openings rather than vias.

Figure 2:
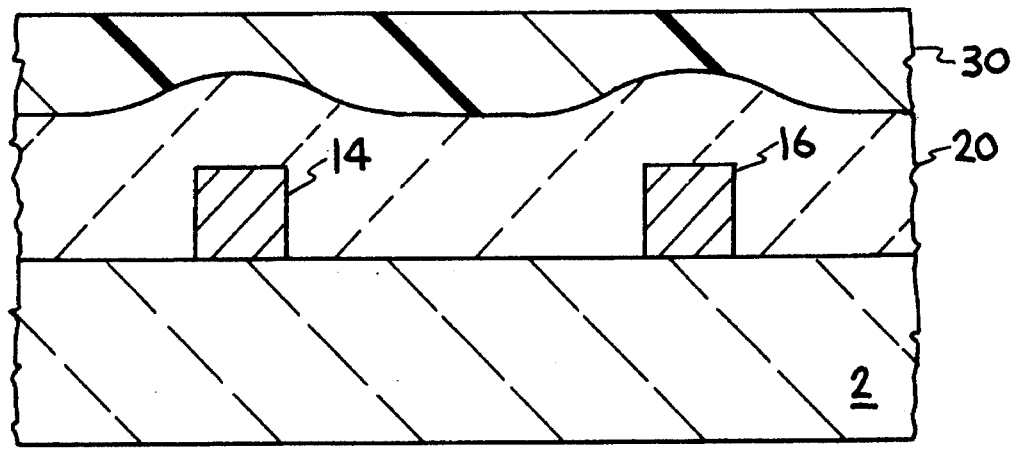
FIG. 2 is a fragmentary vertical cross-sectional view of the structure of FIG. 1 with a planarizing layer of photoresist applied over the conformal insulation layer.

As shown in FIG. 2, preferably insulation layer 20 is planarized prior to the subsequent steps and formation of the fuse structure of the invention, although it is within the scope of the invention to utilize insulation layer 20 in an unplanarized form in the process of the invention. However, subsequently lithography will be more accurate if the surface of insulation layer 20 is planarized at this stage of the process. Such planarization is conventionally accomplished by spinning a layer of photoresist 30 over insulation layer 20 to provide a relatively flat surface. Resist layer 30 and insulation layer 20 are then etched with an etching system which will etch resist and the particular insulation material at the same rate, e.g., when insulation layer 20 comprises silicon oxide, using a reactive ion etch with a fluorine-containing gas as the source of the active species in the plasma, resulting in the planar structure of FIG. 3. The resulting planarized insulation layer will hereinafter be referred to as insulation layer 20a.

Figure 3:
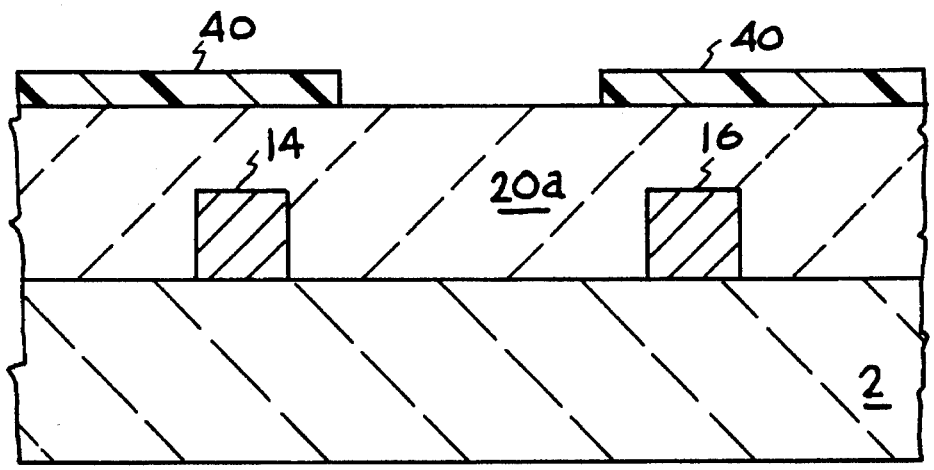
FIG. 3 is a fragmentary vertical cross-sectional view of the structure of FIG. 2 after the structure has been planarized and a further layer of photoresist has been applied and patterned to provide a mask for the formation of a rectangular fuse recess in the insulation layer.
Figure 4:
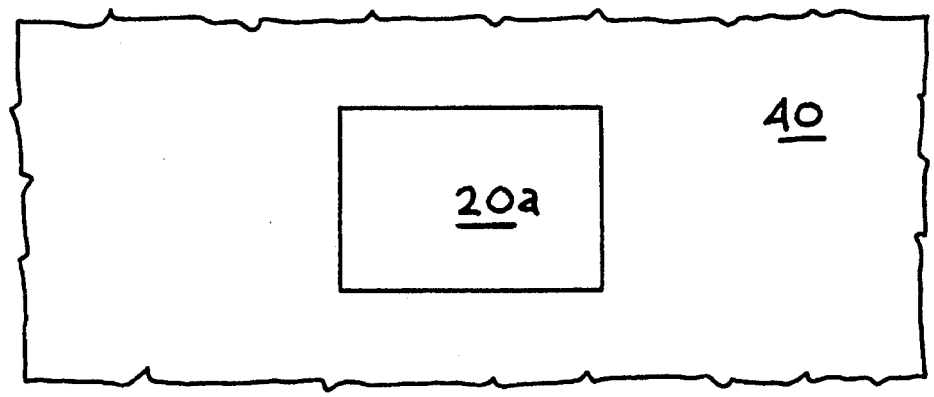
FIG. 4 is a fragmentary top view of the structure of FIG. 3, showing the fuse recess mask.

A rectangular fuse recess mask 40 is then formed over planarized insulation layer 20a by applying a further layer of photoresist over insulation layer 20a and then patterning the resist to form mask 40, as shown in FIGS. 3 and 4.

Figure 5:
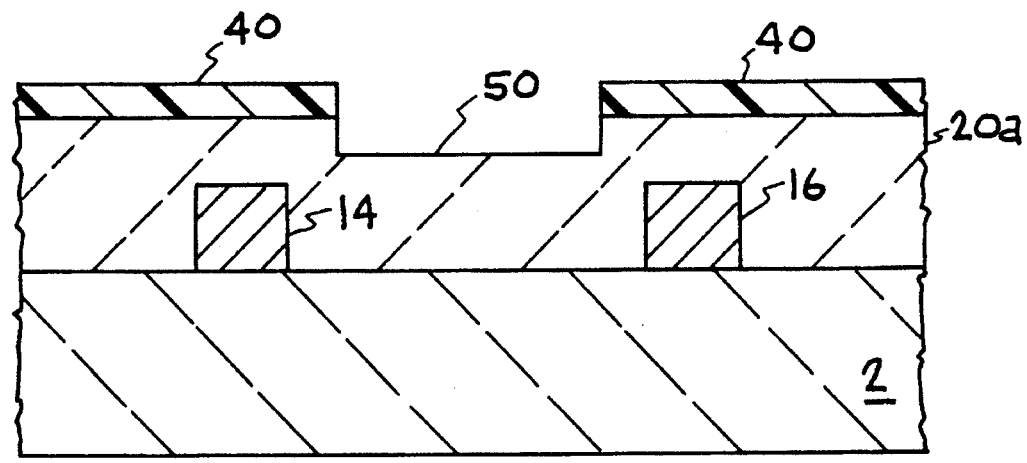
FIG. 5 is a fragmentary vertical cross-sectional view of the structure of FIG. 3 after the fuse recess has been etched in the insulation layer.

Rectangular fuse recess 50 is then formed in insulation layer 20a by anisotropically etching layer 20a through mask 40, as shown in FIG. 5. When insulation layer 20a comprises silicon oxide, as referred to above, a reactive ion etch may be used utilizing a fluorine-containing gas as the source of the reactive species in the plasma. It will be noted that the depth of fuse recess 50 is less than the thickness of insulation layer 20a in the region where fuse recess 50 will be etched into insulation layer 20a. In accordance with the invention, the depth of fuse recess 50 will also be within a range of from 0.01 to 10 times the thickness of the metal layer which will be subsequently deposited over fuse recess 50 to form the fuse of the invention. The depth of fuse recess 50, with respect to both the length and width of the rectangular fuse recess, will also be selected to provide an aspect ratio (height/width) within a range of from 0.01 to 1, preferably from 0.01 to 0.1, This will ensure that the opposite sidewalls of the rectangular fuse recess are spaced sufficiently far apart to form the desired metal stringers on the fuse recess sidewalls, as will be explained below.

Figure 6:
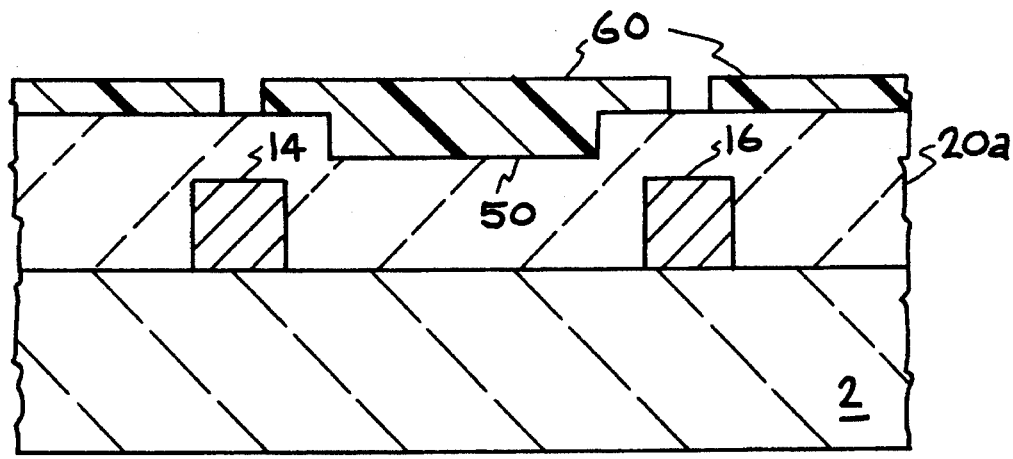
FIG. 6 is a fragmentary vertical cross-sectional view of the structure of FIG. 5 after removal of the fuse mask and formation of a via mask over the structure.
Figure 7:
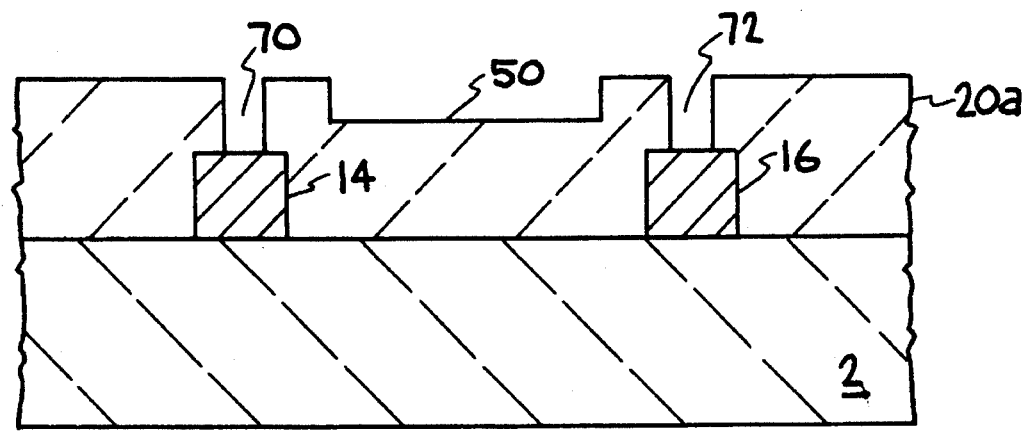
FIG. 7 is a fragmentary vertical cross-sectional view of the structure of FIG. 6 after vias to the underlying metal lines have been etched through the insulation layer and the via mask has been removed.

Following the formation of fuse recess 50, fuse mask 40 may be removed and a via or contact opening mask 60 is then formed over the structure, as shown in FIG. 6. Vias 70 and 72 are then etched through insulation layer 20a respectively to underlying metal lines 10 and 12, as shown in FIG. 7, using the same etching system as previously described for insulation layer 20a.

Figure 8:
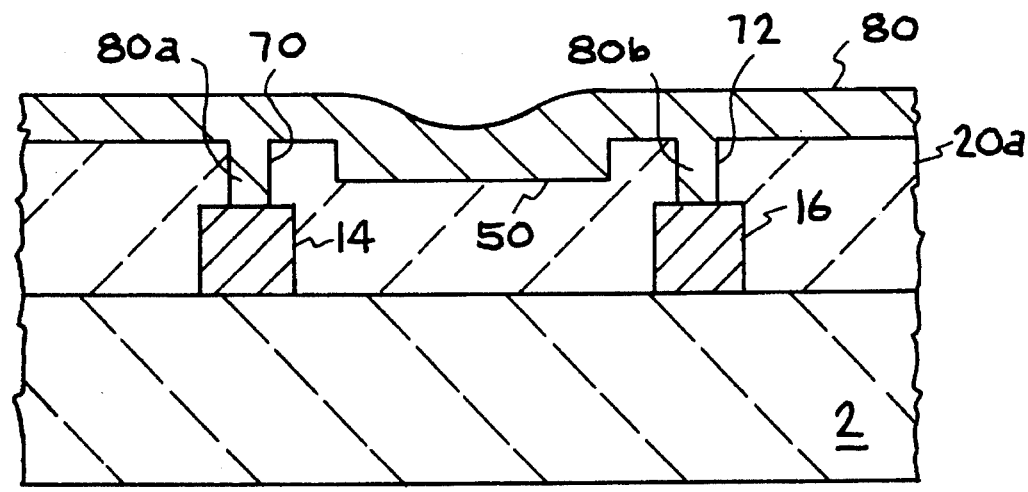
FIG. 8 is a fragmentary vertical cross-sectional view of the structure of FIG. 7 after deposition of a metal layer over the structure which fills the vias and the fuse recess.

Mask 60 is then removed and a metal layer 80 is blanket deposited over the structure, filling vias 70 and 72, as well as fuse recess 50, as shown in FIG. 8. Metal layer 80 may comprise any metal conventionally used in via formation, including titanium, tungsten, and titanium tungsten. Preferably, metal layer 80 will comprise tungsten or a tungsten-based alloy, i.e., an alloy containing at least 50 wt. % tungsten. Therefore, by way of illustration, and not of limitation, metal layer 80 will, hereinafter, be referred to as tungsten layer 80.

Figure 9:
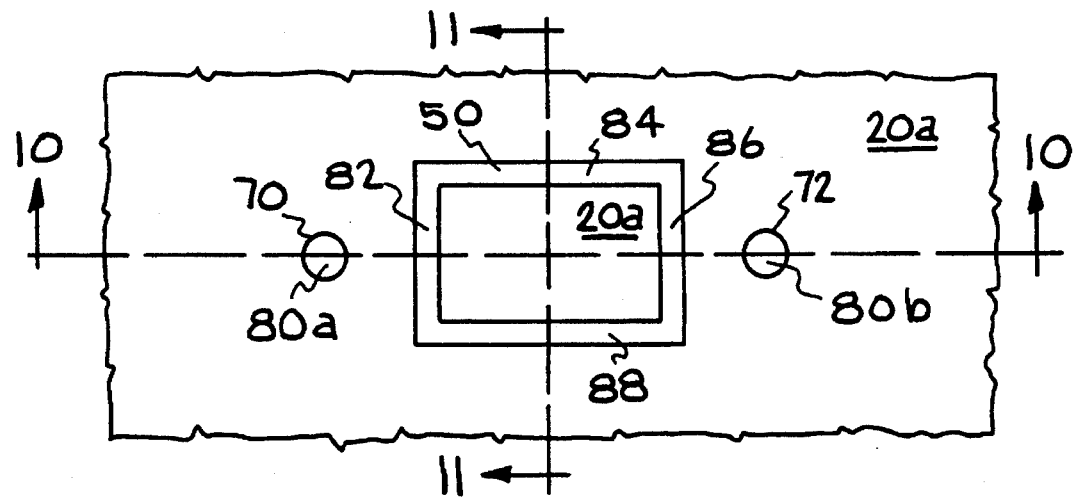
FIG. 9 is a fragmentary top view of the structure of FIG. 8 after the metal layer has been planarized down to the level of the insulation layer, leaving only portions of the metal in the vias and leaving metal stringers on the four sidewalls of the rectangular fuse recess.
Figure 10:
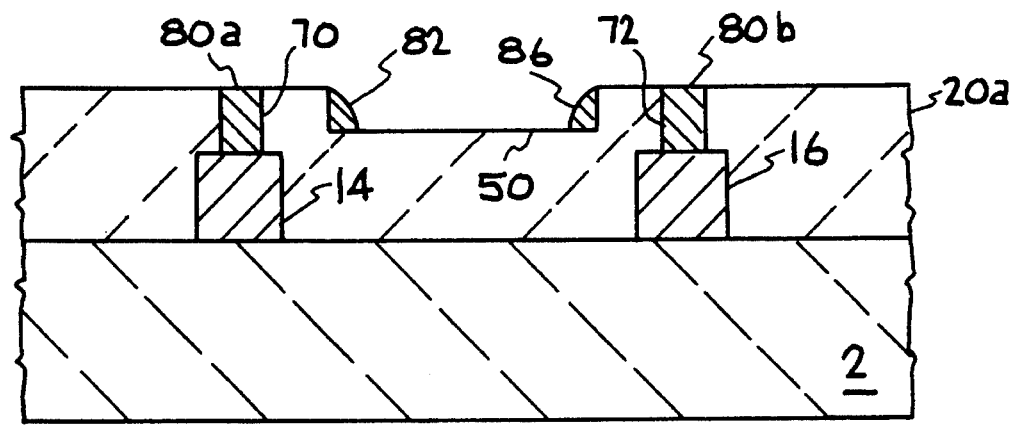
FIG. 10 is a fragmentary vertical cross-sectional view of the structure of FIG. 9 taken along lines 10—10 to show a side-section view of the structure of FIG. 9, illustrating the metal stringers formed on two opposite sidewalls of the fuse recess.
Figure 11:
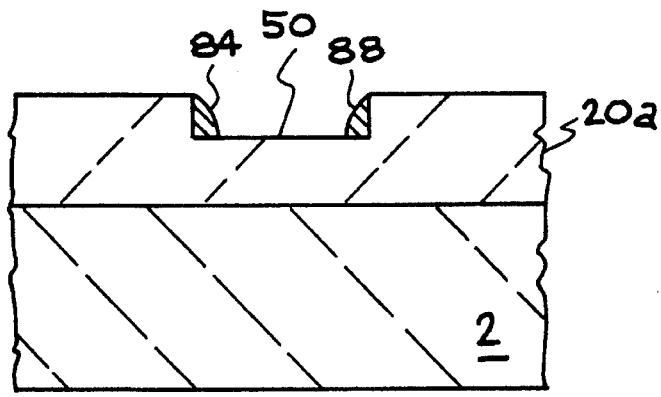
FIG. 11 is a fragmentary vertical cross-sectional view of the structure of FIG. 9 taken along lines 11—11 to show an end-section view of the structure of FIG. 9, illustrating the metal stringers formed on the other two sidewalls of the rectangular fuse recess.

After deposition of tungsten layer 80, and the filling of vias 70 and 72, as well as fuse recess 50, thereby with tungsten metal, tungsten layer 80 is planarized to remove all of the tungsten over insulation layer 20a, leaving only tungsten portions 80a and 80b respectively in vias 70 and 72, and tungsten stringers 82, 84, 86, and 88 respectively on the four sidewalls of rectangular fuse recess 50, as shown in FIGS. 9–11.

Figure 12:
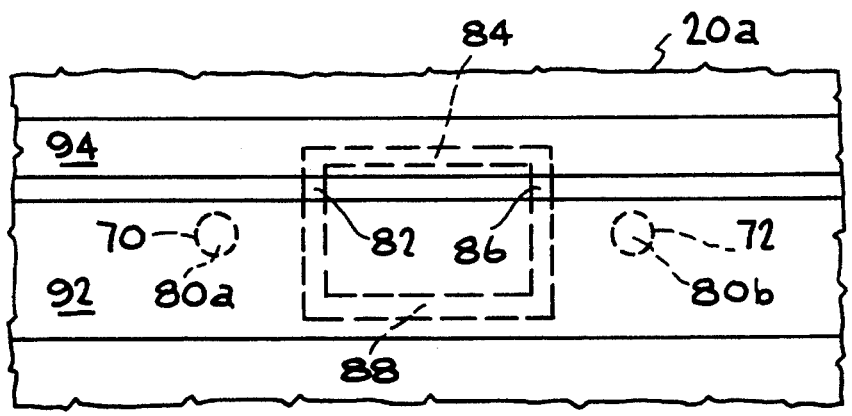
FIG. 12 is a fragmentary top view of the structure of FIG. 9 showing the formation of metal lines over the insulation layer which are respectively connected to opposite ends of two of the metal stringers to form a fuse therebetween.

Following this step, electrical connections may be made to the fuse of the invention simultaneous with the steps of depositing and patterning a metal layer comprising metal lines 92 and 94 over insulation layer 20a to connect to tungsten-filled vias 70 and 72. Thus, as shown in FIG. 12, metal lines 92 and 94 are shown formed over insulation layer 20a, with metal line 92 overlying (and electrically connected to) tungsten plugs 80a and 80b respectively in filled vias 70 and 72, as well as overlying stringer 88, while second metal line 94 overlies stringer 84. Stringers 82 and 86, extending between lines 92 and 94, thus collectively comprise a fuse electrically connecting lines 92 and 94 together.

It should be noted that regardless of what metal constitutes metal layer 80 from which stringers 82–88 are formed, the subsequently deposited metal layer (from which metal lines 92 and 94 are formed) should comprise a different metal than metal layer 80 to thereby permit selective patterning of the subsequent metal layer to form metal lines, such as metal lines 92 and 94, without also etching metal stringers 82–88. Thus, for example, when metal layer 80 comprises tungsten, to permit filling of vias 70 and 72 with tungsten metal (which is a preferred material for filling vias and/or contact openings), the subsequently deposited metal layer which is patterned to form metal lines 92 and 94 preferably constitutes a different metal such as aluminum, or an alloy of aluminum and copper.

Figure 13:
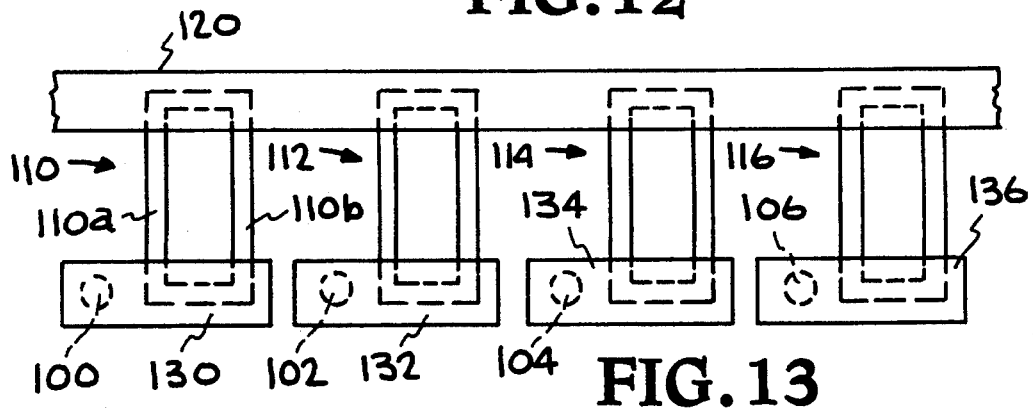
FIG. 13 is another fragmentary top view of an integrated circuit structure containing the fuse structure of the invention and illustrating other ways in which the fuse structure may be utilized.

FIG. 13 shows another example of how the metal fuses of the invention can be utilized to interconnect a common buss with the respective source regions of a number of MOS transistors, each comprising a portion of a separate memory cell. When the particular memory cell is enabled, e.g., through the gate electrode of the MOS transistor, a high current may be passed from the buss line through the fuse to the source region of the particular MOS transistor, thus causing the particular fuse to blow to that memory cell. Thus, for example, when a gate electrode is addressed, of one of a number of transistors represented by their respective source contacts 100, 102, 104, and 106 located on the upper surface of insulation layer 20a, current flows from common buss 120 through fuse 110 and buss 130 to source contact 100 of the first transistor. By flowing a sufficiently high current through common buss 120 to and through fuse 110 to source contact 100, legs 110a and 110b of fuse 110 will melt and be severed, thus disconnecting common buss 120 from source contact 100, i.e., disconnecting common buss 120 from the first transistor. Similarly common buss 120 may be electrically disconnected from the other transistors represented by source contacts 102, 104, and 106, by respectively blowing fuses 112, 114, and 116.

It should also be noted that the steps of masking insulation layer 20a to form the fuse recess mask, followed by the etching of the fuse recess in the insulation layer may, in some circumstances, be combinable with the steps of forming the via mask and etching the via in the insulation layer. That is, the same mask may, in some circumstances, be used for both the vias and the fuse recess, followed by a common etching step in which the fuse recess is formed simultaneous with the cutting of the vias or contact openings through insulation layer 20a. However, such will only be possible when (1): the desired depth of the fuse recess is the same or greater than the depth of the vias to be cut (i.e., the thickness of insulation layer 20a in the region where the fuse recess is to be formed will exceed the thickness of insulation layer 20a in the region where the via is to be cut through insulation layer 20a); and (2): the region of the integrated circuit beneath that portion of insulation layer 20a where the fuse recess will be formed does not have raised portions which would interfere with the formation of a fuse recess of a depth equal to the depth of the via being simultaneously cut (i.e., there must not be raised portions such as raised lines beneath the region of insulation layer 20a where the fuse recess will be cut, since this would thin insulation layer 20a sufficiently in that region so as to risk etching through insulation layer 20a during the formation of the fuse recess at that point while etching deep enough to simultaneously form vias).

Figure 14:
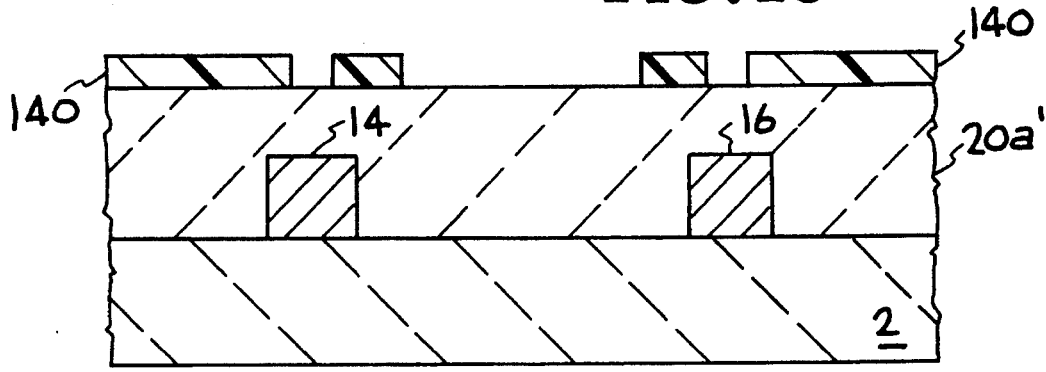
FIG. 14 is a fragmentary vertical side-section view of a mask used in an alternate embodiment of the invention to simultaneously form the fuse recess and the vias in the insulation layer.
Figure 15:
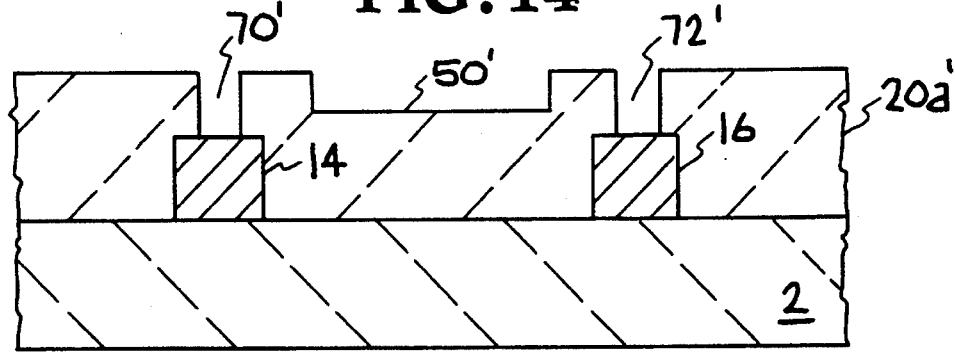
FIG. 15 is a fragmentary vertical side-section view of the structure of FIG. 14 after the insulation layer has been etched to form the vias and fuse recess in a single etch step.

This embodiment is illustrated in FIGS. 14 and 15. FIG. 14 shows fuse recess mask 40 of FIG. 3 and via mask 60 of FIG. 6 combined into a single mask 140 having an opening for the fuse recess and openings for the vias. FIG. 15 shows the result when fuse recess 50' is cut to a depth which equals or exceeds the depth of vias 70' and 72' using such a common mask to simultaneously etch both fuse recess 50' and vias 70' and 72' in insulation layer 20a'.

Thus, the invention provides a process for forming a fuse in an insulation layer and the resulting product wherein additional steps needed for forming such a fuse are minimized or eliminated by forming the fuse in the same insulation layer in which contact openings or vias are formed; using the same metal deposition step used for filling the vias or contact openings to also provide the metal utilized in the fuse; and using the same planarizing step used to remove the portions of the metal layer over the insulation layer, after filling of the vias and fuse recess, to form the metal stringers used as fuses in the invention.

Having thus described the invention what is claimed is:

1. A process for forming an integrated circuit structure comprising one or more metal fuses on an insulation layer formed over other portions of said integrated circuit structure while filling one or more vias or contact openings in said insulation layer with the same metal comprising the steps of:

a) forming one or more rectangular recesses in said insulation layer;

b) forming one or more vias or contact openings through said insulation layer to said integrated circuit structure beneath said insulation layer;

c) subsequently filling said one or more rectangular recesses and said one or more vias or contact openings with metal by depositing a metal layer over said insulation layer;

d) then planarizing said deposited metal layer down to said vias or contact openings to remove those portions of said metal layer which were deposited over said insulation layer leaving metal stringers on sidewalls of said one or more rectangular recesses; and e) then forming one or more metal lines on said insulation layer in electrical contact with at least one end of one or more of said metal stringers;

whereby said metal stringers in contact with said one or more metal lines are formed while filling said vias or contact openings with metal, and said metal stringers will function as a fuse between said one or more lines and other portions of said integrated circuit structure in electrical contact with an opposite end of said metal stringers in contact with said one or more metal lines.

2. The process of claim 1 including the further step of planarizing said insulation layer prior to said step of forming said one or more rectangular recesses therein.

3. The process of claim 1 wherein said metal layer deposited over said insulation layer to fill said one or more vias or contact openings and said one or more rectangular recesses comprises a first metal and said metal lines then formed over said insulation layer in electrical contact with said one or more metal stringers comprises a second metal different from said first metal to thereby permit said metal lines to be patterned from a deposited layer of said second metal in the presence of said metal stringers.

4. The process of claim 1 wherein said metal layer deposited over said insulation layer to fill said one or more vias or contact openings and said one or more rectangular recesses comprises a tungsten-containing metal and said metal lines comprise aluminum.

5. The process of claim 1 wherein said step of forming said one or more rectangular recesses in said insulation layer further comprises etching said insulation layer to a depth which is less than the thickness of said insulation layer in the region being etched.

6. The process of claim 5 wherein said process further includes the steps of forming a rectangular recess mask layer over said insulation layer prior to etching said rectangular recess in said insulation layer, and then etching said one or more rectangular recesses in said insulation layer through said rectangular recess mask.

7. The process of claim 6 which further includes the steps of forming a via or contact opening mask over said insulation layer after etching said insulation layer through said rectangular recess mask to form said one or more rectangular recesses in said insulation layer, and then etching said one or more vias or contact openings in said insulation layer through said via or contact opening mask.

8. The process of claim 1 which includes the further step of forming a single mask over said insulation layer having openings therein for said one or more rectangular recesses and said one or more vias or contact openings; and said steps of forming said one or more rectangular recesses and said one or more vias or contact openings are carded out simultaneously by a single etching step through said single mask.

9. The process of claim 8 wherein said one or more rectangular recesses in said insulation layer are formed by etching said insulation layer to a depth which is equal to or greater than the depth of said one or more vias or contact openings etched in said insulation layer.

10. The process of claim 8 including the further step of planarizing said insulation layer prior to said step of forming said single mask over said insulation layer.

11. The process of claim 1 wherein said step of forming said one or more metal lines on said insulation layer in electrical contact with at least one end of one or more of said metal stringers further comprises forming a metal line in electrical contact with a first end of each of two parallel metal stringers formed on two oppositely spaced apart sidewalls of said rectangular recess.

12. The process of claim 11 wherein a second end of each of said two parallel metal stringers is electrically connected to a contact portion on said insulation layer electrically connected to said integrated circuit structure.

13. A process for forming an integrated circuit structure comprising one or more metal fuses on an insulation layer formed over other portions of said integrated circuit structure while filling one or more vias or contact openings in said insulation layer with the same metal comprising the steps of:

a) forming a rectangular recess mask layer over said insulation layer;

b) forming one or more rectangular recesses in said insulation layer by etching said insulation layer through said rectangular recess mask;

c) forming a via or contact opening mask over said insulation layer after etching said insulation layer through said rectangular recess mask to form said one or more rectangular recesses in said insulation layer;

d) forming one or more vias or contact openings through said insulation layer to said integrated circuit structure beneath said insulation layer by etching said insulation layer through said via or contact opening mask;

e) subsequently filling said one or more rectangular recesses and said one or more vias or contact openings with a tungsten-containing metal by depositing a tungsten-containing metal layer over said insulation layer;

f) then planarizing said deposited tungsten-containing metal layer down to said vias or contact openings to remove those portions of said tungsten-containing metal layer which were deposited over said insulation layer, leaving tungsten-containing metal stringers on sidewalls of said one or more rectangular recesses; and g) then forming one or more aluminum metal lines on said insulation layer in electrical contact with at least one end of one or more of said tungsten-containing metal stringers;

whereby said metal stringers in contact with said one or more metal lines are formed while filling said vias or contact openings with metal, and said metal stringers will function as a fuse between said one or more aluminum metal lines and other portions of said integrated circuit structure in electrical contact with an opposite end of said tungsten-containing metal stringers in contact with said one or more aluminum metal lines.

* * * * *

UNITED STATES PATENT AND TRADEMARK OFFICE
CERTIFICATE OF CORRECTION

PATENT NO. : 5,472,901
DATED : December 5, 1995
INVENTOR(S) : Ashok K. Kapoor

It is certified that error appears in the above-indentified patent and that said Letters Patent is hereby corrected as shown below:

Col. 6, line 32, claim 1, after "layer", insert ",".

Col. 7, line 17, claim 8, change "carded" to "carried".

Col. 7, line 26, claim 10, change "," to ".".

Signed and Sealed this

Thirteenth Day of August, 1996

Attest:

BRUCE LEHMAN

*Attesting Officer*    *Commissioner of Patents and Trademarks*